United States Patent
Lee

(10) Patent No.: US 9,748,265 B1
(45) Date of Patent: Aug. 29, 2017

(54) INTEGRATED STRUCTURES COMPRISING CHARGE-STORAGE REGIONS ALONG OUTER PORTIONS OF VERTICALLY-EXTENDING CHANNEL MATERIAL

(71) Applicant: Micron Technology, Inc., Boise, ID (US)

(72) Inventor: Changhyun Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/176,072

(22) Filed: Jun. 7, 2016

(51) Int. Cl.
| H01L 23/532 | (2006.01) |
| H01L 27/115 | (2017.01) |
| H01L 27/11582 | (2017.01) |
| H01L 23/528 | (2006.01) |
| H01L 27/11556 | (2017.01) |

(52) U.S. Cl.
CPC ...... *H01L 27/11582* (2013.01); *H01L 23/528* (2013.01); *H01L 23/5329* (2013.01); *H01L 27/11556* (2013.01)

(58) Field of Classification Search
CPC ......... H01L 27/11582; H01L 27/11556; H01L 23/528; H01L 53/53292; H01L 23/5329
See application file for complete search history.

(56) References Cited

U.S. PATENT DOCUMENTS

| 9,330,763 | B1* | 5/2016 | Zhang | G11C 11/5642 |
| 9,595,531 | B2* | 3/2017 | Zhu | H01L 27/11548 |
| 2010/0181612 | A1* | 7/2010 | Kito | H01L 27/11551 257/319 |
| 2012/0003828 | A1* | 1/2012 | Chang | H01L 27/1157 438/591 |
| 2013/0215684 | A1* | 8/2013 | Oh | H01L 27/11582 365/185.29 |
| 2014/0273373 | A1* | 9/2014 | Makala | H01L 27/11582 438/270 |
| 2015/0325587 | A1* | 11/2015 | Chen | H01L 27/11582 257/314 |
| 2016/0133640 | A1* | 5/2016 | Zhu | H01L 27/11548 257/316 |

* cited by examiner

*Primary Examiner* — Christine Enad
(74) *Attorney, Agent, or Firm* — Wells St. John P.S.

(57) ABSTRACT

Some embodiments include an integrated structure having stacked conductive levels. At least some of the conductive levels are wordline levels and include control gate regions of memory cells. One of the conductive levels is a vertically outermost conductive level along an edge of the stack. Vertically-extending channel material is along the conductive levels. Some of the channel material extends along the memory cells. An extension region of the channel material is vertically outward of the vertically outermost conductive level. A charge-storage structure has a first region directly between the vertically outermost conductive level and the channel material, and has a second region which extends vertically outward of the vertically outermost conductive level and is along the extension region of the channel material.

8 Claims, 6 Drawing Sheets

INTEGRATED STRUCTURES COMPRISING CHARGE-STORAGE REGIONS ALONG OUTER PORTIONS OF VERTICALLY-EXTENDING CHANNEL MATERIAL

TECHNICAL FIELD

Integrated structures comprising charge-storage regions along outer portions of vertically-extending channel material.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells, and such architecture may be referred to as three-dimensional NAND.

Three-dimensional NAND may have a vertical channel extending along the vertical-stacked memory cells of a NAND string, and the channel may extend to a region under the string (such region may be a source line, a conductive interconnect over another NAND deck, etc.). A problem that may be encountered with three-dimensional NAND is that a segment of the channel which joins with the region under the NAND string may have relatively high resistance as compared to other regions of the channel that extend along the NAND string (and that are gated by memory cells of the NAND string). The high resistance of such segment of the channel may degrade performance of three-dimensional NAND architecture.

It is desired to develop structures which alleviate the above-described problem associated with three-dimensional NAND architecture.

DETAILED DESCRIPTION OF THE ILLUSTRATED EMBODIMENTS

Some embodiments include integrated structures comprising three-dimensional NAND, and comprising charge-storage regions extended to overlap a segment of a vertical channel vertically outward of (i.e., over or under) a NAND string. The charge-storage regions may comprise any suitable composition or combination of compositions; and in some embodiments may comprise floating gate material (for instance, doped or undoped silicon) or charge-trapping material (for instance, silicon nitride, metal dots, etc.). The extended charge-storage regions may enhance current flow along such segment of the vertical channel (i.e., reduce resistance of the segment) as compared to conventional three-dimensional NAND architectures, which may alleviate the type of problem described in the "Background" section of this disclosure. Example embodiments are described below with reference to FIGS. 1-6.

Figure 1:
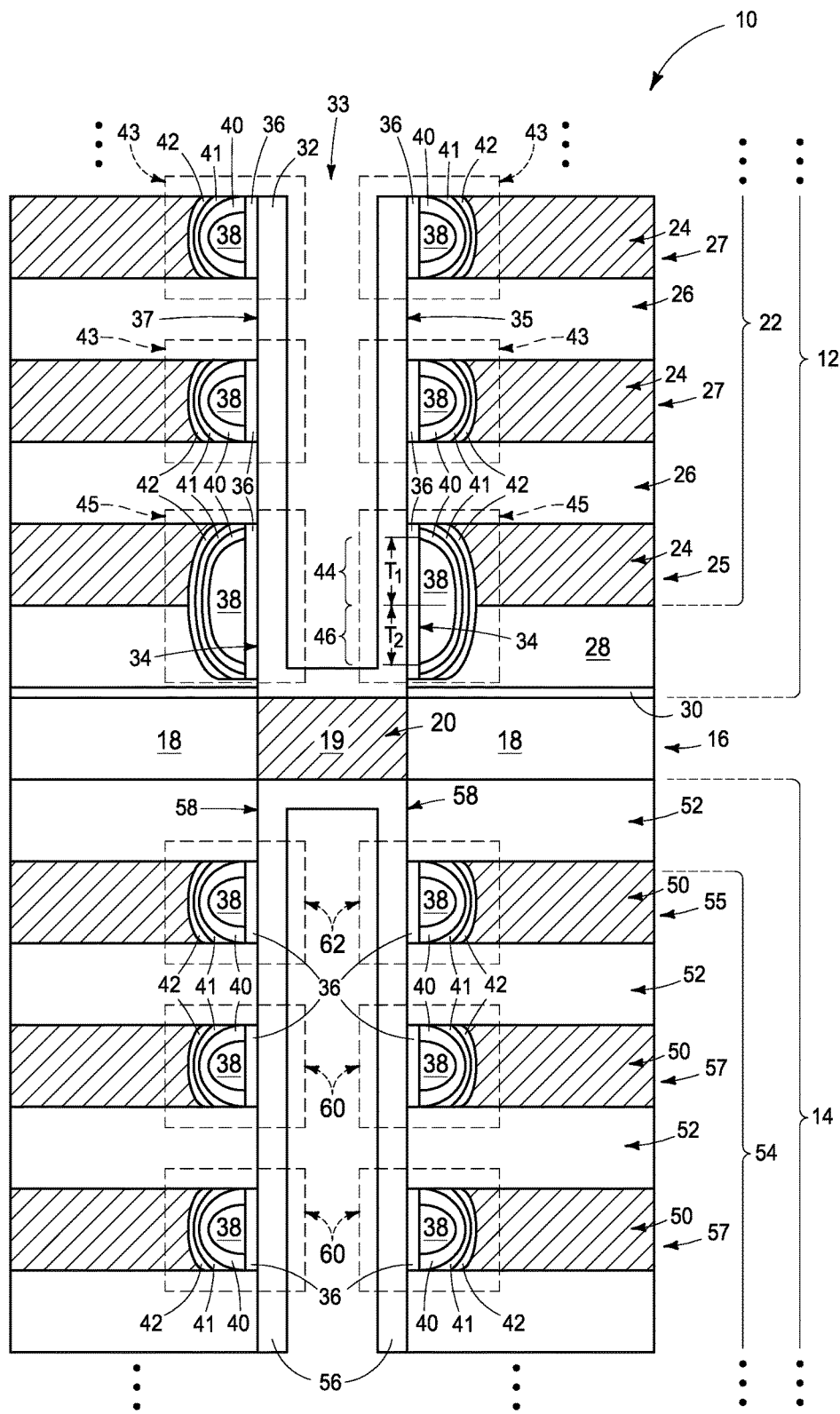
FIGS. 1-6 are diagrammatic cross-sectional views of constructions comprising example embodiment integrated structures.

Referring to FIG. 1, a semiconductor construction (i.e., integrated structure) 10 is shown to comprise a first (upper) deck 12 over a second (lower) deck 14. The decks 12 and 14 are spaced from one another by an intervening region 16. The intervening region 16 includes insulative material 18 and a conductive interconnect 20.

The insulative material 18 may comprise any suitable composition or combination of compositions; and in some embodiments may comprise, consist essentially of, or consist of silicon nitride.

The conductive interconnect 20 comprises conductive material 19. Such conductive material may comprise any suitable composition or combination of compositions, including, for example, conductively-doped semiconductor material (e.g., conductively-doped silicon).

The upper deck 12 comprises a stack 22 of alternating conductive levels 24 and insulative levels 26.

The conductive levels 24 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 20 may comprise n-type doped polycrystalline silicon (i.e., n-type doped polysilicon). The conductive levels 24 are vertically-stacked one atop another.

The insulative levels 26 may comprise any suitable composition or combination of compositions; and may, for example, comprise silicon dioxide.

The levels 24 and 26 may be of any suitable thicknesses. The levels 24 may be of different thickness than the levels 26, or may be the same thickness as the levels 26.

One of the conductive levels 24 is an outermost conductive level along a bottom edge of stack 22, and such outermost conductive level is provided with an additional label 25 so that it may be distinguished from the other conductive levels 24. In some embodiments the outermost conductive level 25 may correspond to a select device level; such as, for example, a source-side select gate (SGS) level.

The remaining conductive levels 24 over outermost level 25 may correspond to wordline levels, and such wordline levels are provided with the additional label 27. Although only a single select device level is illustrated in the shown embodiment, in other embodiments there may be multiple select device levels.

In the illustrated embodiment the select device level 25 comprises a same composition as the wordline levels 27. A wordline level 27 immediately above the select device level 25 may be referred to as being immediately adjacent and vertically inward of the level 25.

The upper deck 12 may continue upwardly beyond the shown region, as indicated by dots above the upper deck; and the stack 22 may continue upwardly as indicated by dots at the top of the bracket utilized to label stack 22.

The upper deck 12 comprises a dielectric material 28 beneath the outermost conductive level 25, and comprises an optional buffer material 30 beneath the dielectric material 28.

Dielectric material 28 may comprise any suitable composition or combination of compositions; and in some embodiments may comprise, consist essentially of, or consist of aluminum oxide (e.g., Al$_2$O$_3$). In the shown embodiment the dielectric material 28 is directly against a vertically outward edge (specifically, a lower edge) 29 of the outermost conductive level 25.

The buffer material 30 may comprise any suitable composition or combination of compositions; and in some embodiments may comprise, consist essentially of, or consist of silicon dioxide. The buffer material may be utilized to alleviate strain that may otherwise exist if dielectric material 28 directly contacts the material 18 of intervening region 16.

Vertically-extending channel material 32 extends along the conductive levels 24. The channel material 32 may comprise any suitable composition or combination of compositions; and in some embodiments may comprise appropriately-doped semiconductor material (e.g., appropriately-doped silicon).

The channel material 32 may be considered to be within an opening 33. In the shown embodiment the channel material partially fills the opening to form a so-called hollow-channel structure. In other embodiments the channel material may completely fill the opening to form a solid pillar. In the illustrated embodiment, the channel material forms a container shape within opening 33. Although such container shape appears to have two opposing lateral sidewalls 35 and 37 in the view of FIG. 1, in practice the opening 33 may have a closed shape when viewed from above (e.g., may be circular, elliptical, polygonal, etc.) and the channel material 32 may wrap entirely around the interior of the opening so that the sidewalls 35 and 37 are actually part of a single continuous sidewall extending entirely around an outer lateral edge of the channel material.

An extension region 34 of the channel material is vertically outward of the vertically outermost conductive level 25 (specifically, is below level 25).

The wordline levels 27 are spaced from the channel material 32 by dielectric material 36, charge-storage material 38 and charge-blocking materials 40-42.

The dielectric material 36 may comprise any suitable composition or combination of compositions; such as, for example, one or more of silicon dioxide, hafnium oxide, zirconium oxide, etc.

The charge-storage material 38 may comprise any suitable composition or combination of compositions; such as, charge-trapping material (e.g., silicon nitride) or floating gate material (e.g., silicon).

The charge-blocking material 40 may comprise any suitable composition or combination of compositions; such as, for example, one or more of silicon dioxide, hafnium oxide, zirconium oxide, etc.

The charge-blocking material 41 may comprise any suitable composition or combination of compositions; such as, for example, silicon nitride.

The charge-blocking material 42 may comprise any suitable composition or combination of compositions; such as, for example, one or more of silicon dioxide, hafnium oxide, zirconium oxide, etc.

The materials 36, 38, 40, 41 and 42 are incorporated into a plurality of NAND memory cells 43. The vertically-stacked memory cells may correspond to serially-coupled memory cells of a NAND string.

The materials 36, 38, 40, 41 and 42 are also between the select device level 25 and channel material 32, and are incorporated into a select device 45. However, the charge-storage material 38 of the select device is extended into the insulative material 28. In some embodiments the charge-storage material 38 between a select device level 25 and the channel material 32 may be considered to correspond to a charge-storage structure having a first region 44 between the select device level 25 and the channel material 32, and having a second region 46 which extends vertically outward of level 25 and along the extension region 34 of channel material 32.

The first region 44 comprises a first vertical dimension $T_1$, and the second region 46 comprises a second vertical dimension $T_2$. In some embodiments the second vertical dimension may be at least as large as the first vertical dimension.

Advantageously the second region 46 of the charge-storage material 38 of the select device may be powered through conductive level 25 and utilized to improve current flow through the extension region 34 of channel material 32 as compared to devices lacking the extended region 46 of the charge-storage material 38. Accordingly, the extended region 46 may enhance current flow along a segment of the vertical channel under a NAND string, and may thereby alleviate, or even prevent, problems of the type described above in the "Background" section of this disclosure.

The conductive levels 24 of upper deck 12 may be referred to as first conductive levels. The lower deck 14 comprises vertically-stacked conductive levels 50, which may be referred to as second conductive levels.

The conductive levels 50 are vertically spaced from one another by insulative levels 52. The conductive levels 50 may comprise any of the compositions described above relative to conductive levels 24; and the insulative levels 52 may comprise any of the compositions described above relative to insulative levels 26. The conductive levels 50 may be identical in composition as conductive levels 24, or may be different in composition relative to conductive levels 24. Also, the insulative levels 52 may be identical in composition as insulative levels 26, or may be different in composition relative to insulative levels 26.

The alternating conductive levels 50 and insulative levels 52 may be considered to form a vertically-extending stack 54 within the lower level 14.

An upper conductive level 50 of lower stack 14 is an outermost conductive level along a top edge of stack 14, and such outermost conductive level is provided with an additional label 55 so that it may be distinguished from the other conductive levels 50. In some embodiments the outermost conductive level 55 may correspond to a select device level; such as, for example, a source-side select gate (SGS) level or a drain-side select gate (SGD) level.

The remaining conductive levels 50 under outermost level 55 may correspond to wordline levels, and such wordline levels are provided with the additional label 57.

Although the upper level 55 is referred to as being a select device level in the illustrated embodiment, in other embodiments it may be a wordline level.

In the illustrated embodiment the select device level 55 comprises a same composition as the wordline levels 57. A wordline level 57 immediately below the select device level 55 may be referred to as being immediately adjacent and vertically inward of the level 55.

The lower deck 14 may continue downwardly beyond the shown region, as indicated by dots below the lower deck; and the stack 54 may continue downwardly as indicated by dots beneath the bracket utilized to label stack 54.

The channel material 32 extending within the first stack 22 of the upper deck 12 may be referred to as a first vertically-extending channel material. A second vertically-extending channel material 56 extends within the stack 54 of the lower deck 14. The second channel material 56 is electrically coupled to the first channel material 32 through the conductive plug 20.

The second channel material 56 may comprise a same composition as the first channel material 32 in some embodiments, or may comprise a different composition than the first channel material 32 in other embodiments.

The second channel material 56 includes an extension region 58 vertically outward of the vertically outermost conductive level 55 (specifically, above level 55).

The materials 36, 38, 40, 41 and 42 are incorporated into a plurality of NAND memory cells 60 within lower deck 14. The vertically-stacked memory cells may correspond to serially-coupled memory cells of a NAND string.

The materials 36, 38, 40, 41 and 42, together with the select device level 55, are incorporated into a select device 62. In the shown embodiment the charge-storage material 38 of the select device 62 is not extended to cover the extension region 58 of the channel material 56. In other embodiments (for instance, the embodiments of FIGS. 3 and 4), the charge-storage material of the select device 68 may be extended to cover such extension region of the gate material.

Figure 2:
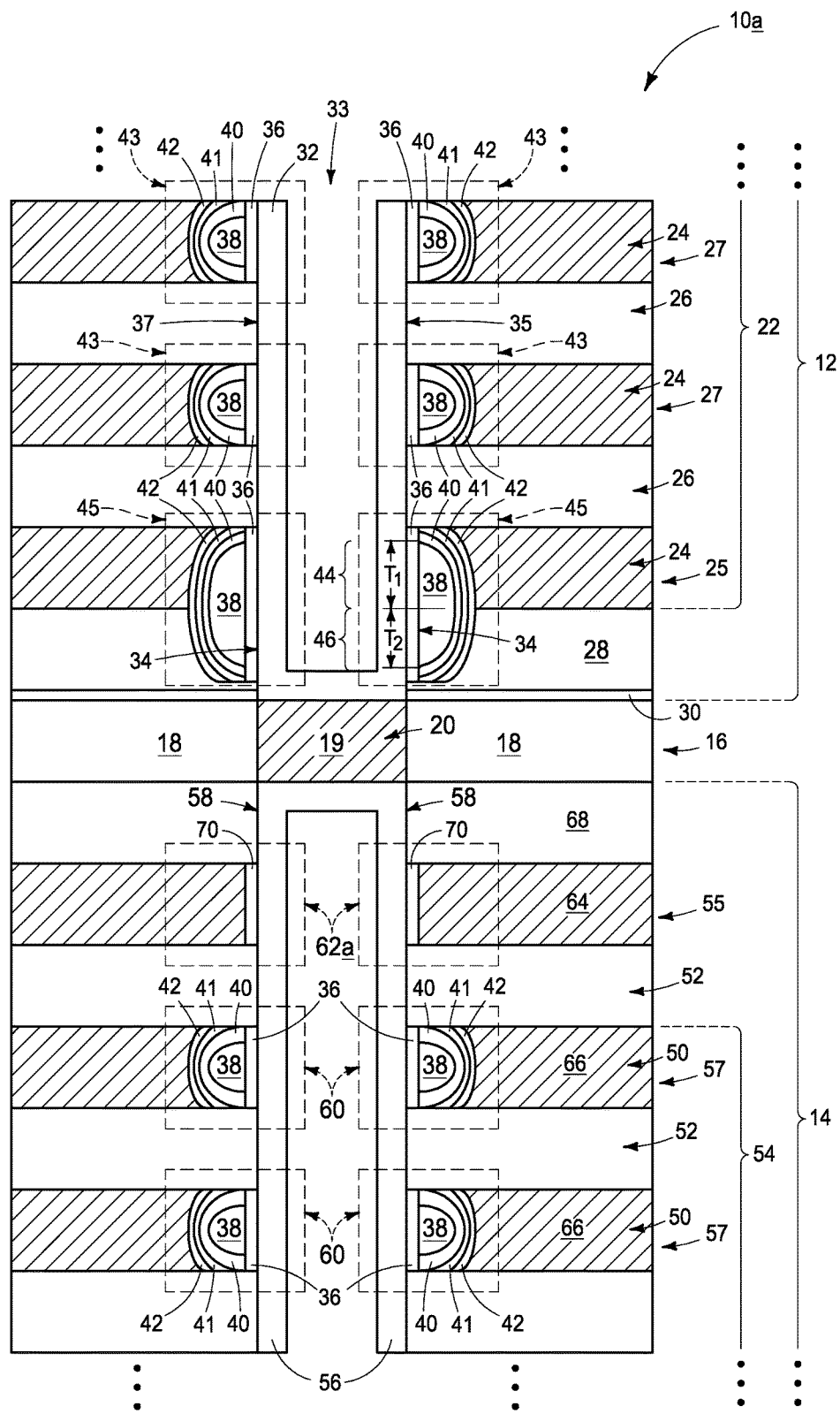

The configuration of FIG. 1 shows the uppermost conductive level 55 of the lower stack 14 having a same composition as an immediately adjacent conductive level 57 (i.e., the conductive level 57 immediately below conductive level 55). In other embodiments, the conductive level 55 may have a different composition than the immediately adjacent conductive level 57. For instance, FIG. 2 shows a construction 10a in which the conductive level 55 comprises a composition 64, while conductive levels 57 comprise a composition 66 different than composition 64. For instance, in some embodiments one of the compositions 64 and 66 may be p-type while the other is n-type. In specific embodiments, the select device level 55 may comprise p-type doped semiconductor material while the wordline levels 57 comprise n-type doped semiconductor material.

The stack 54 of alternating conductive levels 50 and insulative levels 52 starts below the conductive level 55 since conductive level 55 is different from the other conductive levels. An insulative material 68 is above conductive level 55. Such insulative material may be the same as the insulative material of levels 52, or may be different from the insulative material of levels 52. In some embodiments the insulative material 68 and the levels 52 may comprise silicon dioxide.

The conductive material 64 of select device level 55 is spaced from channel material 56 by a single dielectric material 70. Such dielectric material may comprise any suitable composition or combination of compositions; including, for example, one or more of silicon dioxide, hafnium oxide, zirconium oxide, etc.

The lower-level 14 of FIG. 2 comprises the memory cells 60 of the type described above with reference to FIG. 1, and comprises select device 62a in place of the select device 62 of FIG. 1.

The embodiments of FIGS. 1 and 2 have charge-storage material extended to overlap the lower extension 34 of the channel material 32 within upper deck 12, but do not have charge-storage material extended to overlap the upper extension 58 of the channel material 56 within the lower deck 14. In other embodiments charge-storage material may be configured to overlap the upper extension region 58 of the lower deck either in addition to having charge-storage material overlapping the lower extension region 34 of the upper deck, or alternatively to having charge-storage material overlapping the lower extension region 34 of the upper deck. A couple of example embodiments are described with reference to FIGS. 3 and 4.

Figure 3:
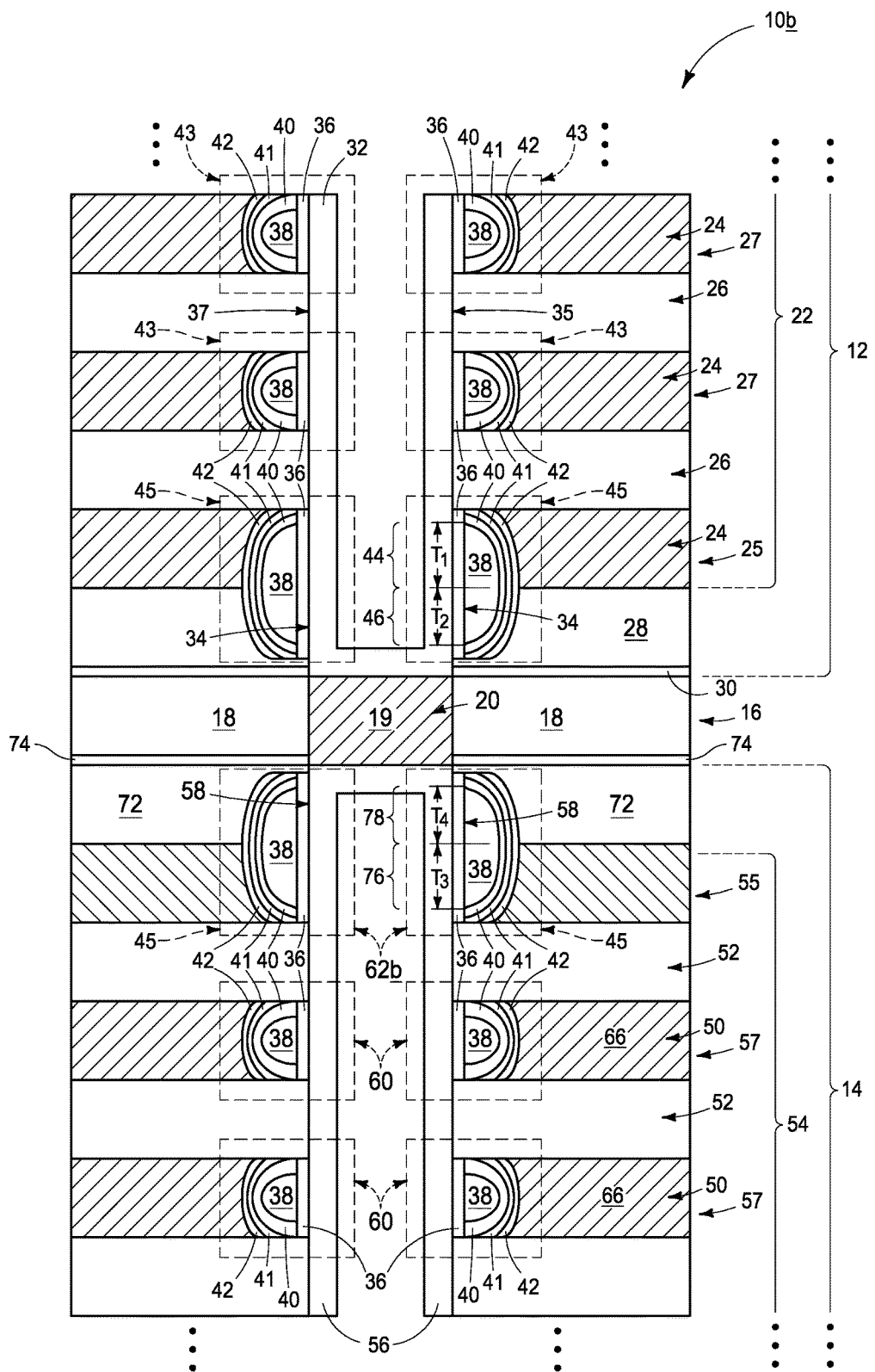

Referring to FIG. 3, a construction 10b comprises the upper deck 12 having the configuration of FIG. 1, and comprises a lower deck 14 similar to the lower deck of FIG. 1. However, an upper insulative material of the lower deck of FIG. 3 is an insulative material 72 analogous to the material 28 of the upper deck, and comprising, for example, aluminum oxide. In some embodiments, the materials 28 and 72 may be referred to as first and second insulative materials (or as first and second dielectric materials). Such first and second insulative materials may be compositionally the same as one another in some embodiments (e.g., may both comprise aluminum oxide), and may be compositionally different from one another in other embodiments.

The insulative material 72 is spaced from insulative material 18 of intervening region 16 by an optional buffer material 74 analogous to the buffer material 30, and comprising, for example, silicon dioxide.

The select device level 55 of FIG. 3 comprises a same composition as wordline levels 57, similar to the embodiment of FIG. 1. However, FIG. 3 comprises a select device 62b different from the select device 62 of FIG. 1. Specifically, select device 62b comprises charge-storage material 38 which extends into insulative material 72 and overlaps the upper extension region 58 of channel material 56.

In some embodiments the charge-storage material 38 within select device 62b may be considered to correspond to a charge-storage structure having a first region 76 between the select device level 55 and the channel material 56, and having a second region 78 which extends vertically outward of level 55 and along the extension region 58 of channel material 56.

In some embodiments, the charge-storage material 38 within the select device 45 of the upper deck may be considered to form a first charge-storage structure having first and second regions 44 and 46 (discussed above with reference to FIG. 1), and the charge-storage material within the select device 62b of the lower deck may be considered to form a second charge-storage structure having third and fourth regions 76 and 78. In such embodiments, the third region 76 may be considered to comprise a third vertical dimension $T_3$, and the fourth region 78 may be considered to comprise a fourth vertical dimension $T_4$. In some embodiments ratio $T_4/T_3$ may be about the same as the ratio $T_2/T_1$, and in other embodiments ratio $T_4/T_3$ may be different than the ratio $T_2/T_1$. The term "about the same" means that the ratios are the same as one another to within reasonable tolerances of fabrication and measurement.

Advantageously, the region 78 of the charge-storage material 38 of the select device 62b may be powered through conductive level 55 and utilized to improve current flow through the extension region 58 of channel material 56 as compared to devices lacking the extended region 78 of the charge-storage material 38. Accordingly, the extended region 78 may enhance current flow along a segment of the vertical channel above a NAND string in a lower deck, and may thereby alleviate, or even prevent, problems of the type described above in the "Background" section of this disclosure.

Figure 4:
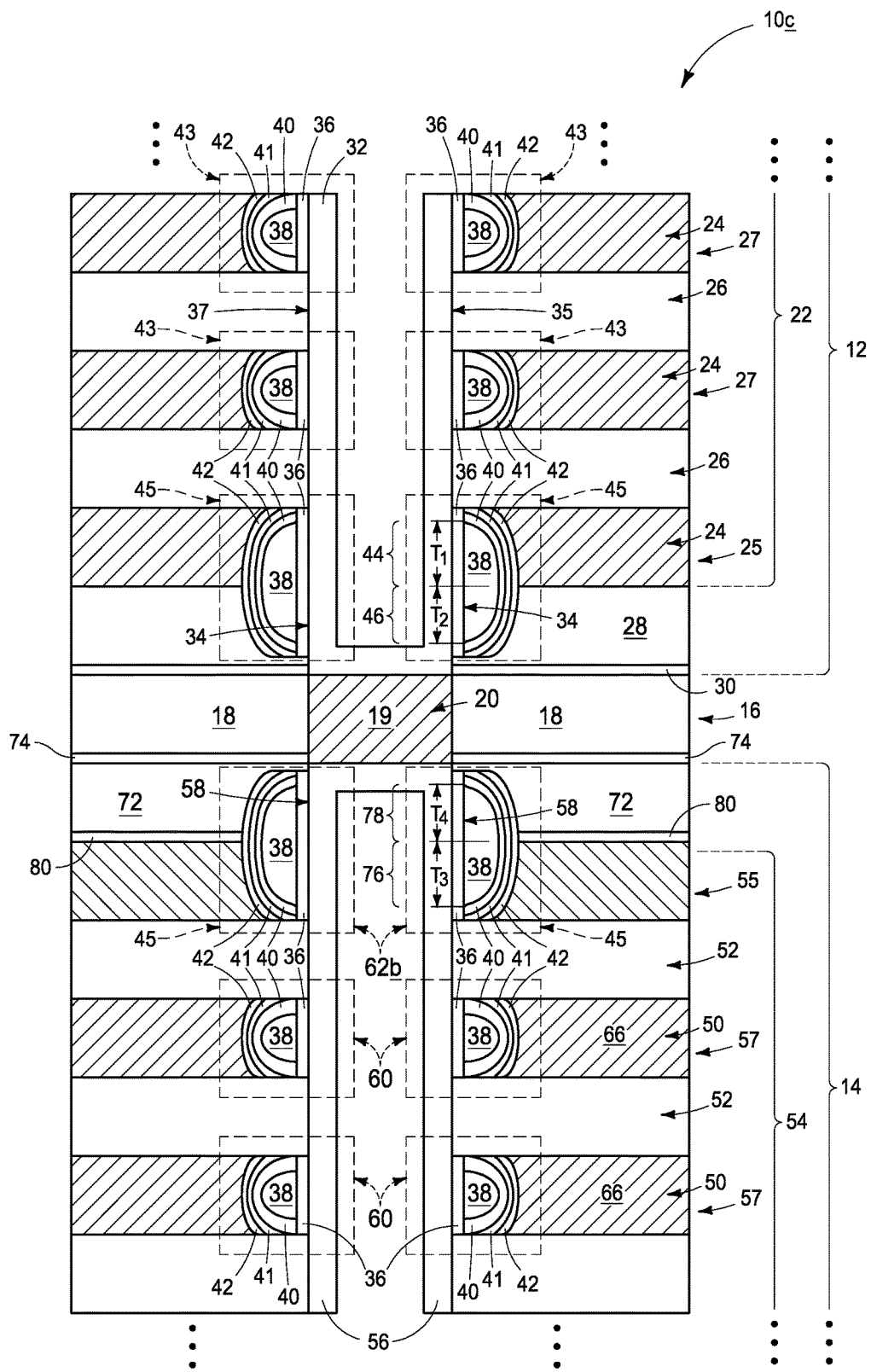

FIG. 4 shows a construction 10c analogous to the construction of FIG. 3, but comprising an optional buffer material 80 between conductive material of select device level 55 and the insulative material 72. Such buffer material may alleviate stress between conductive material of the level 55 (for instance, conductively-doped silicon) and the composition of material 72 (for instance, aluminum oxide). The buffer material 80 may comprise any suitable composition or combination of compositions; and in some embodiments may comprise silicon dioxide. A similar optional buffer material (not shown) may be provided between insulative material 28 and the conductive material of the select device level 25 in upper deck 12.

Figure 5:
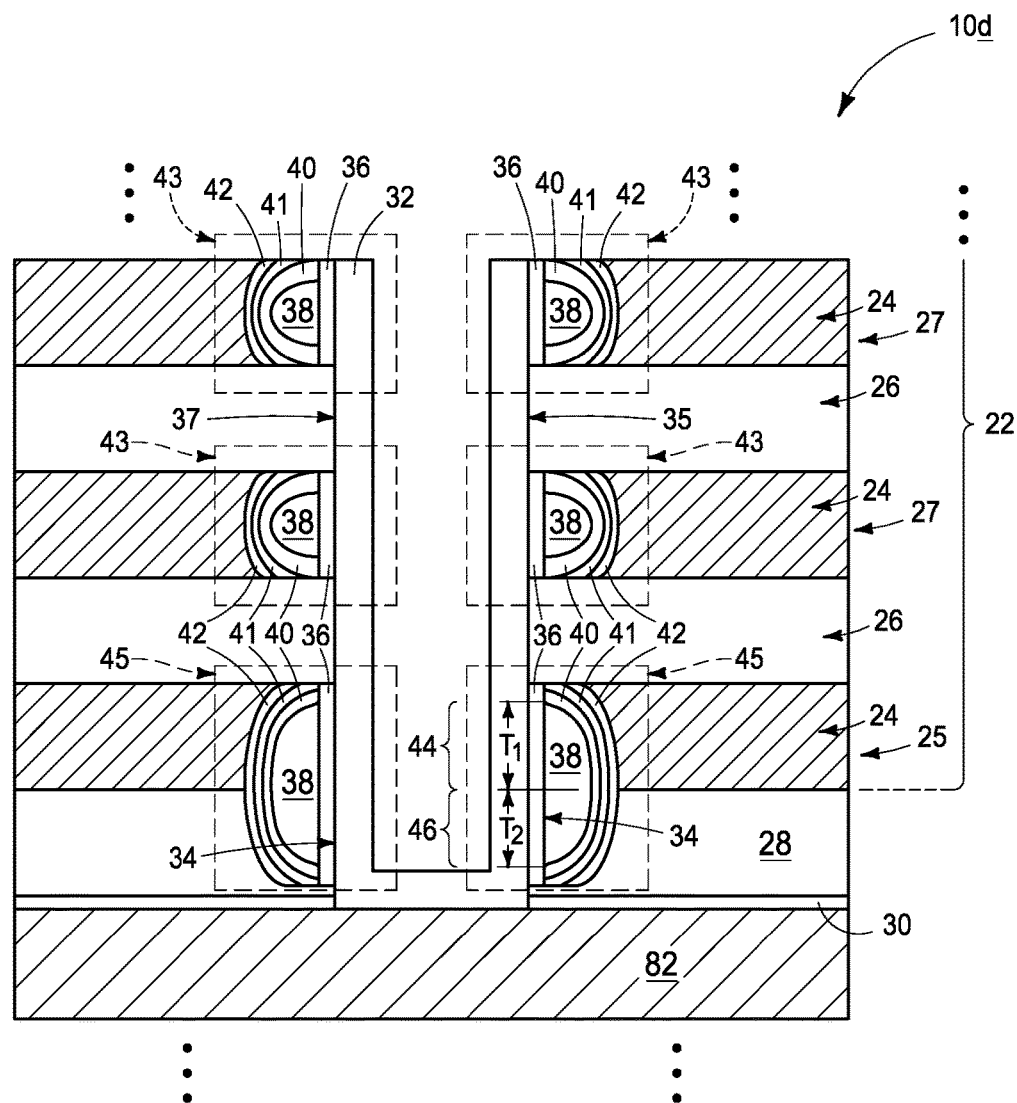
Figure 6:
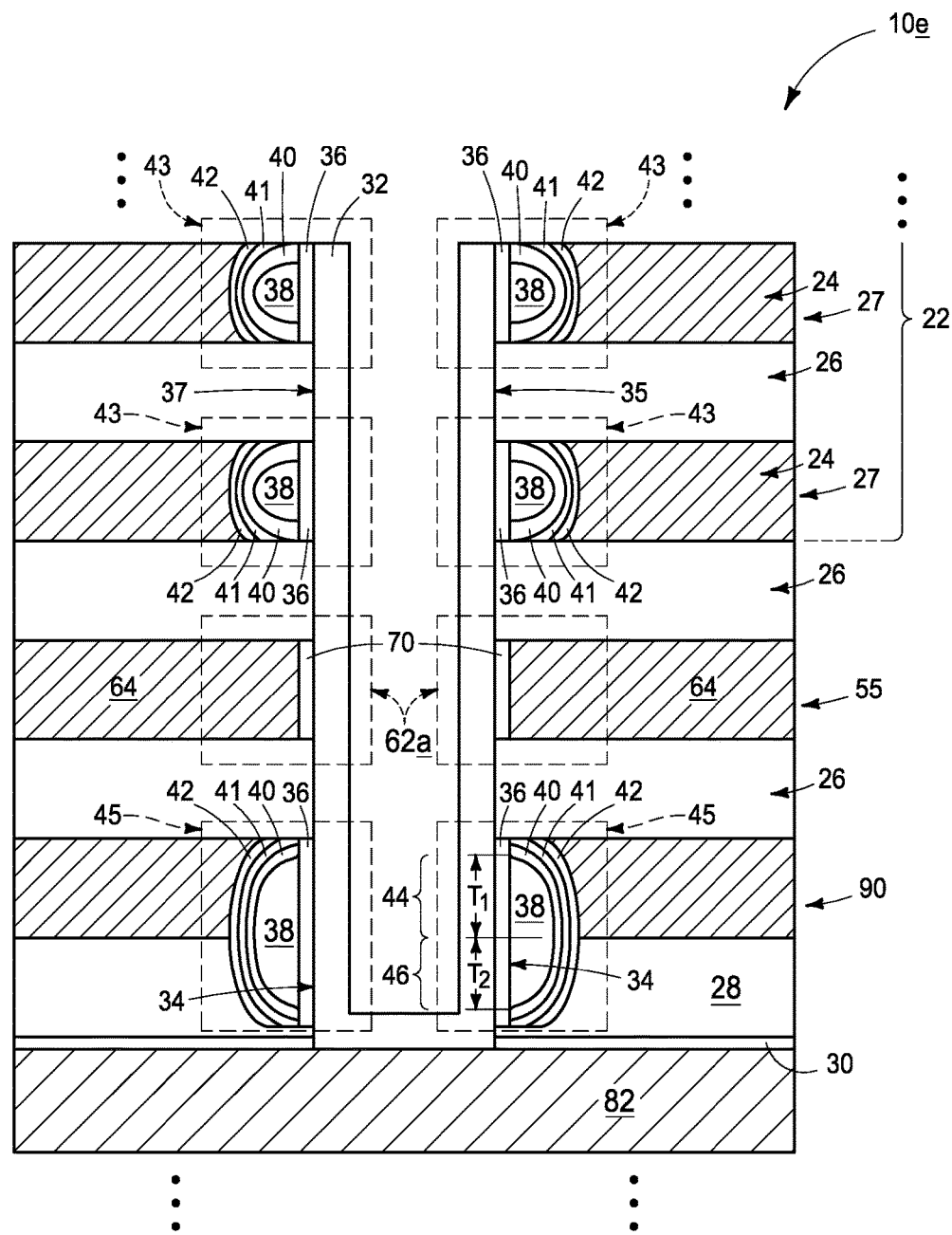

The embodiments of FIGS. 1-4 illustrate multi-deck NAND configurations. FIGS. 5 and 6 illustrated embodiments which may be utilized in either single deck configurations or multi-deck configurations.

Referring to FIG. 5, a construction 10d comprises vertically-stacked wordline levels 27 over a select device level 25. The levels 25 and 27 may be identical in composition to another, and may be comprised by a stack 22 of conductive levels 24 alternating with insulative levels 26.

The insulative material 28 is under the lowestmost conductive level 25. Insulative material 28 may comprise, for example, aluminum oxide.

The optional buffer material 30 is under the insulative material 28, and such buffer material may comprise, for example, silicon dioxide.

A conductive source material 82 is under the buffer material 30. Source material 82 may be part of a source line, and may comprise, for example, conductively-doped semiconductor material (e.g., n-type doped silicon). The shown material 82 may be over other conductive materials of the source line (not shown) which may include metals and/or metal-containing compositions.

Vertically-extending channel material 32 extends along the wordline levels 27, the select device level 25 and the insulative material 28. The lower region 34 of the channel material is below the select device level 25 and along the insulative material 28.

Memory cells 43 are along the wordline levels 27 and comprise the charge-storage material 38 in addition to the various materials 36, 40, 41 and 42 described previously.

A select device 45 is along the select device level 25 and comprises the charge-storage material 38, and the various materials 36, 40, 41 and 42.

The charge-storage material comprised by select device 45 includes the first and second regions 46, with the second region 46 being along the lower region 34 of the vertically-extending channel material 32. Advantageously the region 46 of the charge-storage material 38 of the select device 45 may be powered through conductive level 25 and utilized to improve current flow through the lower region 34 of channel material 32 as compared to devices lacking the extended region 46 of the charge-storage material 38. Accordingly, the extended region 46 may enhance current flow along a segment of the vertical channel below a NAND string comprising wordline levels 27, and may thereby alleviate, or even prevent, problems of the type described above in the "Background" section of this disclosure.

FIG. 6 shows a construction analogous to that of FIG. 5, except that the select device level 55 comprises the material 64 discussed above with reference to FIG. 2. Accordingly, the select device of FIG. 6 is a device 62a analogous to the device described above with reference to FIG. 2. The wordline levels 27 are within a stack 22 of alternating conductively-doped levels and insulative levels 26. The select device level 55 is below such stack and comprises a material 62 different than the material within wordline levels 27. For instance, wordline levels 27 may comprise n-type doped material while select device material 64 is p-type doped semiconductor material.

A conductive level 90 is beneath the select device level 55, and spaced from such select device level by insulative material. In the shown embodiment, the insulative material between levels 55 and 90 is within a level 26 the same as the insulative levels provided between the wordline levels 27. In other embodiments different insulative material may be provided between levels 55 and 90.

The conductive material of level 90 may be any suitable conductive material, including, for example, conductively-doped semiconductor, metal, metal-containing compositions, etc. In some embodiments conductive level 90 may have a composition matching that of wordline levels 27, and in other embodiments may have a composition matching that of the select device level 55. In some embodiments the select device level 55 may comprise semiconductor material doped to a first dopant type, and the conductive level 90 may comprise semiconductor material doped to a second dopant type, with one of the first and second dopant types being p-type and the other being n-type. In particular embodiments, the select device level 55 may be p-type doped and the level 90 may be n-type doped.

In some embodiments the level 90 may be a conductive booster level, and may have no function except to provide current to the region of gate material 32 below the select device level 55. Charge-storage material 38 is provided between booster level 90 and the channel material 32, and such charge-storage material has a region 44 between the booster level 90 and the channel material, as well as another region 46 along a portion of the channel material beneath the booster level.

In some embodiments the conductive level 90 may be more than simply a conductive booster level, and may provide other functions to an integrated circuit besides increasing current flow through the lower region of the channel material 32.

The structures described above with first to FIGS. 1-6 may be comprised by integrated circuit assemblies, and accordingly may be supported by semiconductor substrates; such as, for example, a semiconductor substrate which comprises, consists essentially of, or consists of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure comprising stacked conductive levels. At least some of the conductive levels are wordline levels and comprise control gate regions of memory cells. One of the conductive levels is a vertically outermost conductive level along an edge of the stack. Vertically-extending channel material is along the conductive levels. Some of the channel material extends along the memory cells. An extension region of the channel material is vertically outward of the vertically outermost conductive level. A charge-storage structure has a first region directly between the vertically outermost conductive level and the channel material, and has a second region which extends vertically outward of the vertically outermost conductive level and is along the extension region of the channel material.

Some embodiments include an integrated structure comprising an upper deck having stacked first conductive levels. At least some of the first conductive levels are first wordline levels and comprise control gate regions of memory cells. One of the first conductive levels is a lowermost first conductive level. A lower deck is under the upper deck and comprises stacked second conductive levels. At least some of the second conductive levels are second wordline levels and comprise control gate regions of memory cells. One of the second conductive levels is an uppermost second conductive level. First vertically-extending channel material is along the first conductive levels. A lower region of the first vertically-extending channel material is below the lowermost first conductive level. Second vertically-extending channel material is along the second conductive levels. An upper region of the second vertically-extending channel material is above the uppermost second conductive level. Also included is at least one of the following structures: a first charge-storage structure having a first region directly between the lowermost first conductive level and the first vertically-extending channel material, and having a second region which extends below of the lowermost first conductive level and along the lower region of the first vertically-extending channel material; and a second charge-storage structure having a third region directly between the uppermost second conductive level and the second vertically-extending channel material, and having a fourth region which extends above the uppermost second conductive level and along the upper region of the second vertically-extending channel material.

Some embodiments include an integrated structure comprising stacked wordline levels, a select device level under the stacked wordline levels, and a dielectric material under the select device level. Vertically-extending channel material is along the wordline levels, the select device level and the dielectric material. A lower region of the channel material is below the select device level and along the dielectric material. A charge-storage structure has a region which is below the select device level and along the lower region of the channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated structure, comprising:
   an upper deck comprising stacked first conductive levels, at least some of the first conductive levels being first wordline levels and comprising control gate regions of memory cells; one of the first conductive levels being a lowermost first conductive level;
   a lower deck is under the upper deck, with the lower deck comprising stacked second conductive levels, at least some of the second conductive levels being second wordline levels and comprising control gate regions of memory cells; one of the second conductive levels being an uppermost second conductive level;
   first vertically-extending channel material along the first conductive levels; a lower region of the first vertically-extending channel material being below the lowermost first conductive level;
   second vertically-extending channel material along the second conductive levels;
   an upper region of the second vertically-extending channel material being above the uppermost second conductive level; and
   at least one of the following structures:
      a first charge-storage structure having a first region directly between the lowermost first conductive level and the first vertically-extending channel material, and having a second region which extends below of the lowermost first conductive level and along the lower region of the first vertically-extending channel material; and
      a second charge-storage structure having a third region directly between the uppermost second conductive level and the second vertically-extending channel material, and having a fourth region which extends above the uppermost second conductive level and along the upper region of the second vertically-extending channel material; and wherein the integrated structure includes the first charge-storage structure and does not include the second charge-storage structure.

2. The integrated structure of claim 1 wherein the second region of the first charge-storage structure extends into a dielectric material comprising aluminum oxide.

3. The integrated structure of claim 1 wherein an uppermost second conductive level is a select device level.

4. An integrated structure, comprising:
- an upper deck comprising stacked first conductive levels, at least some of the first conductive levels being first wordline levels and comprising control gate regions of memory cells; one of the first conductive levels being a lowermost first conductive level;
- a lower deck is under the upper deck, with the lower deck comprising stacked second conductive levels, at least some of the second conductive levels being second wordline levels and comprising control gate regions of memory cells; one of the second conductive levels being an uppermost second conductive level;
- first vertically-extending channel material along the first conductive levels; a lower region of the first vertically-extending channel material being below the lowermost first conductive level;
- second vertically-extending channel material along the second conductive levels;
- an upper region of the second vertically-extending channel material being above the uppermost second conductive level; and
- at least one of the following structures:
  - a first charge-storage structure having a first region directly between the lowermost first conductive level and the first vertically-extending channel material, and having a second region which extends below of the lowermost first conductive level and along the lower region of the first vertically-extending channel material; and
  - a second charge-storage structure having a third region directly between the uppermost second conductive level and the second vertically-extending channel material, and having a fourth region which extends above the uppermost second conductive level and along the upper region of the second vertically-extending channel material; and
- wherein the integrated structure includes the second charge-storage structure and does not include the first charge-storage structure.

5. The integrated structure of claim 4 wherein the fourth region of the second charge-storage structure extends into a dielectric material comprising aluminum oxide.

6. An integrated structure, comprising:
- stacked wordline levels, a select device level under the stacked wordline levels, and a dielectric material under the select device level;
- vertically-extending channel material along the wordline levels, the select device level and the dielectric material; a lower region of the channel material being below the select device level and along the dielectric material;
- a charge-storage structure having a region which is below the select device level and along the lower region of the channel material; and
- wherein said region of the charge-storage structure is a second region, wherein a conductive booster level is under the select device level, and wherein the charge-storage structure has a first region directly between the conductive booster level and the channel material.

7. The integrated structure of claim 6 wherein the select device level comprises semiconductor material doped to a first dopant type, and wherein the conductive booster level comprises semiconductor material doped to a second dopant type; with one of the first and second dopant types being p-type and the other being n-type.

8. The integrated structure of claim 7 wherein the first and second dopant types are p-type and n-type, respectively.

* * * * *